United States Patent
Wang et al.

(10) Patent No.: US 9,941,147 B2
(45) Date of Patent: Apr. 10, 2018

(54) TRANSFER APPARATUS AND LASER ANNEALING APPARATUS

(71) Applicant: BOE TECHNOLOGY GROUP CO., LTD., Beijing (CN)

(72) Inventors: Xueyong Wang, Beijing (CN); Qingrong Ren, Beijing (CN); Lu Wang, Beijing (CN); Yan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/182,953

(22) Filed: Jun. 15, 2016

(65) Prior Publication Data

US 2017/0010230 A1    Jan. 12, 2017

(30) Foreign Application Priority Data

Jul. 7, 2015 (CN) .......................... 2015 1 0395184

(51) Int. Cl.
*H01L 21/683* (2006.01)
*H01L 21/67* (2006.01)

(52) U.S. Cl.
CPC .... *H01L 21/6838* (2013.01); *H01L 21/67288* (2013.01)

(58) Field of Classification Search
CPC ................ H01L 21/6838; H01L 21/67288
See application file for complete search history.

(56) References Cited

U.S. PATENT DOCUMENTS

| 5,923,966 A | 7/1999 | Teramoto et al. |
| 6,495,404 B1 * | 12/2002 | Teramoto ............ H01L 21/2026 |
| | | 257/E21.134 |

FOREIGN PATENT DOCUMENTS

| CN | 1485892 A | 3/2004 |
| CN | 102465338 A | 5/2012 |
| JP | 2014-011296 A | 1/2014 |

OTHER PUBLICATIONS

Chinese Office Action in Chinese Application No. 201510395184.0, dated Jun. 2, 2017 with English translation.

* cited by examiner

*Primary Examiner* — Selim Ahmed
(74) *Attorney, Agent, or Firm* — Collard & Roe, P.C.

(57) ABSTRACT

A transfer apparatus includes a supporting member, a free electron excitation device and a detection device; the free electrons excitation device is configured to excite semiconductor material of an object to be transferred to generate free electrons, and the detection device is configured to detect whether material of a surface of the transferred object in contact with the support surface of the supporting member is conductive under excitation by the free electron excitation device. A laser annealing apparatus comprising the transfer apparatus is further provided.

20 Claims, 2 Drawing Sheets

TRANSFER APPARATUS AND LASER ANNEALING APPARATUS

CROSS REFERENCE TO RELATED APPLICATIONS

Applicant claims priority under 35 U.S.C. § 119 of Chinese Application No. 201510395184.0 filed on Jul. 7, 2015, the disclosure of which is incorporated by reference.

TECHNICAL FIELD

Embodiments of the present disclosure are related to a transfer apparatus and a laser annealing apparatus.

BACKGROUND

With rising and development of flat display devices, low temperature polysilicon technique has become a synonym for high quality display devices. In recent years, major manufacturers of display panel begin to invest and build low-temperature polysilicon (LTPS) production lines in sequence due to its rapid development and promising future.

Excimer laser annealing process is an important step for forming polysilicon. In a conventional excimer laser annealing (ELA) apparatus, it is required to place a substrate onto a substrate stage manually. However, it is difficult to distinguish between the glass side of the substrate and a silicon side of the substrate on which an a-silicon film is formed because the two sides are similar in color. Mistakes are prone to occur in visually discriminating the two sides from each other. If a mistake occurs, serious consequences will be caused. For example, if the glass side of the substrate is placed upward by mistake and is irradiated by a laser beam, the laser beam will pass through the substrate and is irradiated on an alignment film (e.g., PI film), and this irradiation may cause the alignment film to be ashed and the ash thus produced is diffused around the process chamber of an LEA apparatus, which causes the apparatus contaminated and unnecessary cost to clean the process chamber.

SUMMARY

At least one embodiment of the present disclosure provides a transfer apparatus which comprises: a supporting member, a free electron excitation device, which is configured to excite free electrons in a semiconductor material of an object to be transferred; and a detection device, which is configured to detect whether material of a surface of the object to be transferred in contact with a support surface of the supporting member becomes conductive.

In an embodiment, when an object is transferred by the transfer apparatus, if the transferred object contains a semiconductor material, the free electron excitation device will excite free electrons in the semiconductor material, such that the semiconductor material become conductive.

In an embodiment, in transferring of a substrate, the substrate is disposed on the supporting member, and an a-silicon film formed on a side of the substrate generates free electrons therein under excitation by the free electrons excitation device and becomes conductive, while the other side of the substrate is a substrate surface and is of an insulating material and will not generate free electrons therein under excitation by the free electron excitation device and therefore does not become conductive. Thus, when a substrate is transferred by the mechanical arm for excimer laser annealing, if the detecting device detects that a surface of the substrate in contact with the support surface of the supporting member becomes conductive, it can be determined that the a-silicon film is formed on the surface of the substrate in contact with the support surface. If the a-silicon film side of the substrate is disposed in contact with the support surface of the supporting member, when the substrate is placed on the substrate support member of the excimer laser annealing apparatus by the transfer apparatus, the a-silicon film side of the substrate faces the excimer laser. Thus, the transfer apparatus of the embodiment is configured to transfer the substrate during the excimer laser annealing process and can detect whether the a-silicon film side of the substrate faces the excimer laser when it is placed in the excimer laser annealing apparatus, that is, whether the substrate is placed properly.

In one embodiment of the present disclosure, the free electron excitation device is a thermal excitation device, an optical excitation device, or an electromagnetic excitation device.

In one embodiment of the present disclosure, the electromagnetic excitation device comprises an electromagnet attached inside the supporting member.

In one embodiment of the present disclosure, the electromagnetic excitation device comprises a power supply unit, the electromagnet comprises a coil that comprises two terminals, and the power supply is electrically connected to the two terminals of the coil of the electromagnet and is configured to supply power to the coil.

In one embodiment of the present disclosure, the detecting device comprises at least two electrodes which are attached to the support surface of the supporting member and are configured to be in contact with a surface of the objected to be transferred when the object is supported by the supporting member in operation; a voltage source, which is connected with the at least two electrodes in series and is configured to apply a voltage to the at least two electrodes; and a current detecting module, which is connected with the at least two electrodes in series and is configured to detect whether a current is generated between the at least two electrodes.

In one embodiment of the present disclosure, the at least two electrodes are each of a stripe electrode and extend respectively along an edge of a region in which the electromagnet is disposed.

In one embodiment of the present disclosure, the support surface of the supporting member is provided with at least one cushion member, and the at least one cushion member is configured to suck the surface of the object to be transferred.

In one embodiment of the present disclosure, the supporting member comprises at least two support arms, each of which is provided with at least one cushion member, and the free electron excitation device and the detection device are provided on same one supporting arm.

At least one embodiment of the present disclosure provides a laser annealing apparatus, which comprises a substrate support member, a laser configured to provide a laser beam, and any one of the transfer apparatuses as described above. For example, the laser is an excimer laser.

In one embodiment, the transfer apparatus is configured to transfer the substrate and can detect whether the a-silicon film side of the substrate faces the laser when the substrate is placed in the laser annealing apparatus.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
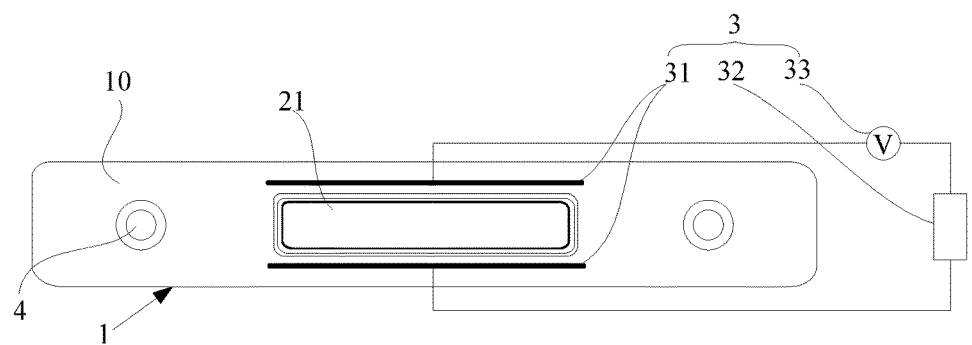
FIG. 1 is an illustrative structural view of a transfer apparatus according to one embodiment of the present disclosure.
Figure 2:
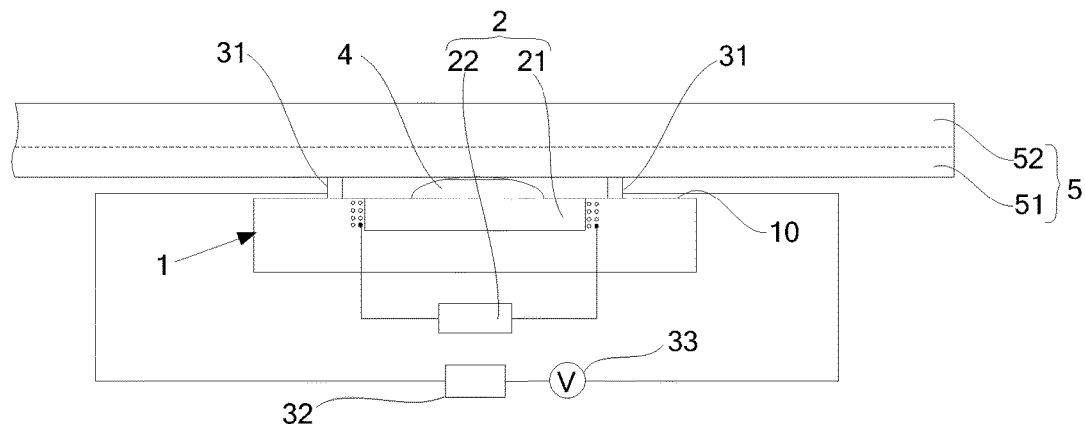
FIG. 2 is an illustrative structural view of a vertical section of a transfer apparatus according to one embodiment of the present disclosure.

As illustrated in FIGS. 1 and 2, a transfer apparatus according to one embodiment of the present disclosure comprises a supporting member 1, and further comprises: a free electron excitation device 2, which is configured to excite the semiconductor material in an object to be transferred to generate free electrons therein; and a detection device 3, which is configured to detect whether the material in a surface of the object to be transferred in contact with a support surface of the supporting member 1 is conductive or not. The supporting member 1 is for example a support table or a support rail.

If the transfer apparatus carries an object which comprises a semiconductor material, the free electron excitation device can excite the semiconductor material to generate free electrons therein, thereby the semiconductor material being conductive at that time.

As illustrated in FIG. 2, a substrate 5 to be subject to a laser annealing process comprises an a-silicon film surface 51 and a substrate surface 52 disposed opposite to the a-silicon film surface 51. When the transfer apparatus carries the substrate 5 to be subject to laser annealing process to proceed, the substrate 5 is supported by the supporting member 1, and the substrate 5 is moved to the site for process. The a-silicon film surface 51 of the substrate 5 can generate free electrons therein under excitation of the free electron excitation device and thus become electrically conductive, while the other surface, i.e., the substrate surface 52 of the substrate 5 is still of insulating material, will not generate free electrons therein under excitation of the free electron excitation device and is not conductive. Thus, when the substrate 5 is transferred by the transfer apparatus, if the detection device 3 detects that a surface of the substrate in contact with the support surface 10 of the supporting member 1 is conductive, it can be determined that the surface of the substrate 5 in contact with the support surface of the supporting member is the a-silicon film surface. Then, if the transfer apparatus places the substrate 5 on the substrate support member 1 of the laser annealing apparatus, the a-silicon film surface faces toward the substrate support member and faces away from the excimer laser. On the other hand, if the detection device 3 detects that a surface of the substrate in contact with the support surface 10 of the supporting member 1 is not electrically conductive, it can be determined that the surface of the substrate 5 in contact with the support surface of the supporting member is the substrate surface 52. Then, if the transfer apparatus places the substrate 5 on the substrate stage (e.g., support member) of the laser annealing apparatus, the a-silicon film surface 51 of the substrate 5 faces towards the excimer laser. In accordance with the detection result, wrong placement of the substrate 5 to be subject to a laser annealing process can be cured, and thus manufacturing cost can be reduced.

As described above, when the transfer apparatus transfers the substrate during an laser annealing process, it can be detected whether the a-silicon film surface of the substrate faces toward the excimer laser or not when the substrate is placed on the excimer annealing apparatus, that is, whether the substrate is placed properly or not.

In one embodiment of the present disclosure, as illustrated in FIG. 2, the free electrons excitation device 2 can be embodied as a heat excitation device, a light excitation device or an electromagnetic field excitation device. Because Si is a kind of tetravalent element and each atom has four outmost electrons and therefore has four units of negative charges, valence electrons in the covalent bond of Si do not suffer bound as strong as valence electrons in covalent bond of an insulator. If receiving some energy from outside (such as via light irradiation, temperature raise, electromagnetic excitation, and so on), some valence electrons will undergo breakage of covalent bond and become free electrons. Thus, the free electron excitation device 2 configured to excite the a-silicon film to generate free electrons the can be a heat excitation device, a light excitation device or an electromagnetic field excitation device for example.

Figure 3:
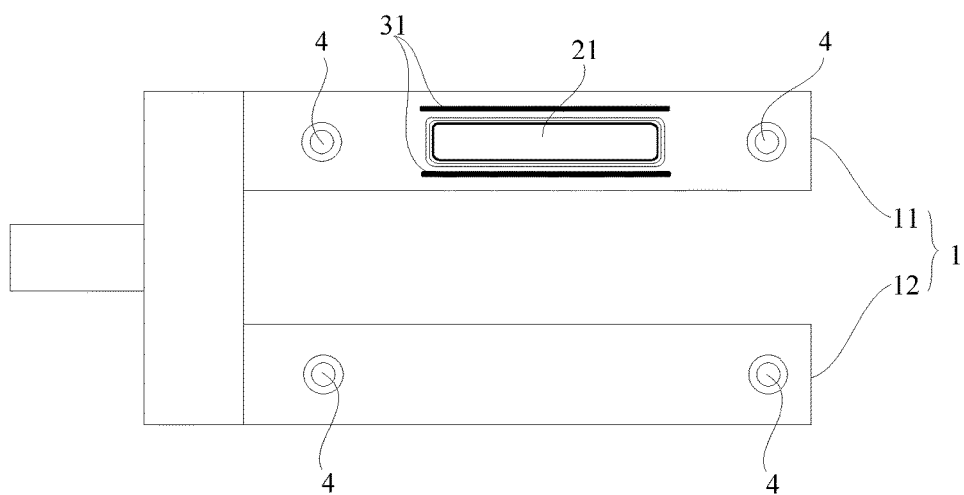
FIG. 3 is an illustrative structural view of a transfer apparatus according to another embodiment of the present disclosure.

In one embodiment of the present disclosure, as illustrated in FIGS. 1, 2 and 3, if the free electrons excitation device 2 is an electromagnetic field excitation device, the electromagnetic field excitation device can comprise an electromagnet 21 attached to the supporting member 1. The electromagnetic field generated by the electromagnet 21 due to application of current can excite the a-silicon film 51 to generate free electrons. If the a-silicon film 51 of the substrate 5 generates free electrons under excitation of the electromagnet 21, it is required to dispose the a-silicon film 51 in the electromagnetic field generated by the electromagnet 21. In one embodiment of the present disclosure, the electromagnet 21 is attached to the support surface 10 of the supporting member 1 or to a surface of the supporting member 1 opposite to the support surface 10.

In one embodiment of the present disclosure, as illustrate in FIG. 2, the electromagnet 21 can comprise a core and a coil; the electrifying state of the electromagnet 21 can be controlled by applying a current or no current to the coil, and further, the appearance or disappearance of electromagnetic field can be controlled by controlling the electrifying state of the electromagnet 21. Therefore, the electromagnetic field excitation device can further comprise a power supply device 22, which is connected to two terminals of the coil in the electromagnet 21 and is configured to supply power to the coil. The electromagnet 21 is not supplied a current when the transfer apparatus stands by, that is, no electromagnetic field is required, so as to save power consumption. The power supply device 22 can comprise a battery or a port connected to an external electrical power source.

In one embodiment of the present disclosure, as illustrate in FIG. 2, an example of the detection device can comprise: two electrodes 31, which are mounted on the support surface 10 of the supporting member 1 and are configured to be in contact with a surface of an object to be transferred; a voltage source 33, which is connected with the two electrodes 31 in series and configured to supply a voltage to the two electrodes 31; and a current detection module 32, which is connected with the two electrodes 31 in series and configured to detect whether a current is generated between the two electrodes or not.

As illustrated in FIG. 2, when the transfer apparatus transfers a substrate 5 thereon, the substrate 5 is disposed on the supporting member 1, and a surface of the substrate 5 in contact with the support surface 10 of the supporting member 1 can be in contact with the two electrodes 31 of the detection device 3 also. As the two electrodes 31, the voltage source 33 and the current detection module 32 are connected in series, if the material on the surface of the substrate 5 in contact with the support surface 10 of the supporting member 1 becomes capable of conducting a current, the conduct material, the two electrodes 31, the voltage source 33 and the current detection module 32 form a series closed loop, and the current detection module 32 can detect a current. Thus, if the free electrons excitation device 2 excites the a-silicon film surface 51 to generate free electrons so as to make the a-silicon film surface 51 become conductive, and if the a-silicon film surface 51 is in contact with the support surface 10 of the supporting member 1, i.e., in contact with the two electrodes 31 of the detection device 3, the a-silicon film surface 51, the two electrodes 31, the voltage source 33 and the current detection module 32 form a series closed loop, and the current detection module 32 can detect a current. If the a-silicon film surface 51 is not in contact with the support surface 10 of the supporting member 1, the current detection module 32 can not detect a current. Thus, when the transfer apparatus transfers a substrate thereon, the free electrons excitation device 2 and the detection device are in operation, if the current detection module 32 of the detection device 3 detects a current, it means that the a-silicon film surface 51 of the substrate 5 is in contact with the support surface 10 of the supporting member 1, that is, when the substrate 5 is placed on the substrate support member of the laser annealing apparatus, the a-silicon film surface of the substrate faces towards the substrate support member, and if current detection module 32 of the detection device 3 detects no current, it means that the a-silicon film surface 51 of the substrate 5 is not in contact with the support surface 10 of the supporting member 1, that is, when the substrate 5 is placed on the substrate support member of the laser annealing apparatus, the a-silicon film surface 51 of the substrate 5 faces away from the substrate support member and towards the excimer laser.

It should be noted that, the detection device 3 can comprise more than two electrodes and the connections among the electrodes, the voltage source and the current detection module can be conducted in a similar way. Details will not be elaborated herein.

Furthermore, a current source, in stead of the voltage source, can be used for detecting a current, which will not be elaborated herein.

In one embodiment of the present disclosure, the current detection module 32 can have an alarming function. When the current detection module 32 detects a current, it will alarm so as to notify the operator of wrong placement of the substrate 5. The alarming function can be implemented by an alarming device by way of light, voice, or the like. During the process of excimer laser annealing on the substrate 5 in batch, the alarming function can improve efficiency and save manpower. In another example, the transfer apparatus of the embodiment comprises a driving device (e.g., a motor), and the current detection module 32 can be connected with a driving device of the transfer apparatus in signal. If the current detection module 32 detects a current, a signal is sent to the driving device, and the transfer apparatus will stop operation.

On basis of the description above, in one modified embodiment of the present disclosure, as illustrated in FIG. 1 and FIG. 2, the two electrodes 31 can have a shape of stripe, and are disposed extending along two side edges of a region in which the electromagnet 21 is disposed, respectively. Intensity of the electromagnetic field is strong in an area adjacent to the region in which the electromagnet 21 is disposed, and the a-silicon film of the substrate in operation will generate more free electrons under excitation by the electromagnetic field. Thus, the two electrodes 31 are disposed extending along two side edges of the region in which the electromagnet 21 is disposed, respectively, if the two electrodes 31 are in contact with the a-silicon film surface 51, a region of the a-silicon film between the two electrodes 31 (i.e., a region of the a-silicon film which forms a closed electric loop together with the two electrodes 31) is the region of a-silicon film which generates most free electrons, and a strong current will be generated between the two electrodes 31. Thus, the situation can be avoided that the current detection module 32 can not detect a current due to small intensity of current even if few free electrons are generated in the a-silicon film 51.

In one modified embodiment of the present disclosure, as illustrated in FIG. 1, FIG. 2 and FIG. 3, the support surface 10 of the supporting member 1 is further provided with a cushion member 4 which is configured to suck a surface of the objected to be transferred. The cushion member 4 can suck the object to be transferred through at one suction hole provided thereon to stabilize the object during transferring. Further, the cushion member 4 disposed between the object to be transferred and the support surface 10 can have a function of buffering so as to protect the object from being damaged during transferring. As illustrated in FIG. 2, when the object to be transferred is a substrate 5, a surface of the substrate 5 is sucked by the cushion member 4, thus the substrate 5 is kept from being moved with respect to the support surface 10 so as to protect the substrate 5 from being slipped or damaged.

In one embodiment of the present disclosure, the supporting member 1 can comprise at least two supporting arms. As illustrated in FIG. 3, the supporting member 1 comprises a support arm 11 and a support arm 12, each of which is provided with two cushion members 4. Of course, the amount of the cushion members 4 provided on each support arm is not limited, and can be determined according to factors, such as size of the substrate 5 or the like. The electromagnet 21 of the free electrons excitation device 2 and the electrodes 31 of the detection device 3 can be mounted on the same support arm.

At least one embodiments of the present disclosure provides a laser annealing apparatus, comprising: a substrate stage and a laser (e.g., an excimer laser, a CO2 laser, or the like) configured to generate laser beam for irradiating a substrate for an annealing process, and the laser annealing apparatus further comprising any one of the transfer apparatus as described above, and for example, the transfer apparatus belongs to or is provided within the substrate stage for support. For example, the laser annealing apparatus can effectively avoid wrong placement of an a-silicon film surface of a substrate to be subject laser annealing process. Thus, damage to the substrate or defect of the substrate due to wrong placement of the substrate during laser annealing process can be avoided. Further, the excimer laser annealing apparatus can improve efficiency, save manpower, and reduce manufacturing cost to a great extent. For example, the laser annealing apparatus is an excimer laser annealing apparatus adopting an excimer laser for irradiating a substrate for an annealing process.

Figure 4:
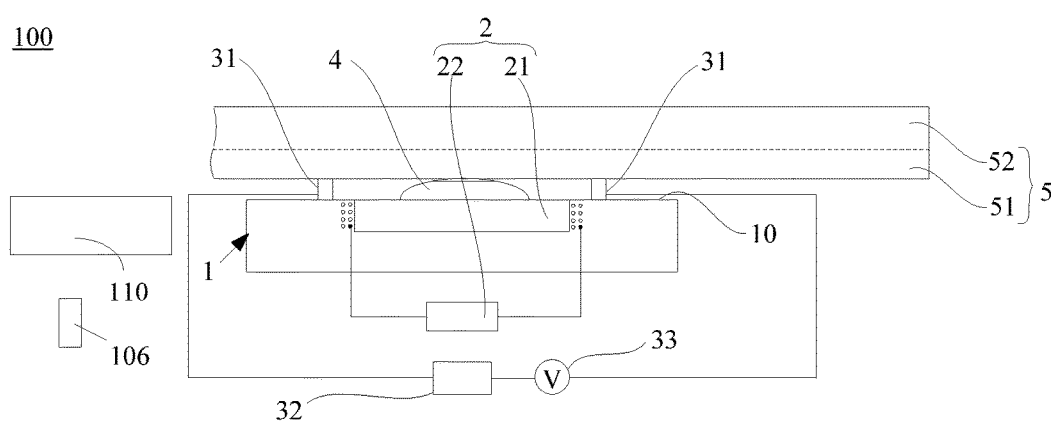
FIG. 4 is an illustrative structural view of a laser annealing apparatus according to an embodiment of the present disclosure.

As illustrated in FIG. 4, the excimer laser annealing apparatus 100 of an embodiment comprises a substrate stage 100 that is in connection and cooperation with any one of the above-described exemplary transfer apparatuses and an excimer laser 106 configured to generate laser beam for irradiating a substrate that is transferred by the transfer apparatus and placed on the substrate stage 110. The excimer laser 6 is provided on the same side as the support member 1 of the transfer apparatus and operates to irradiate the a-silicon film of the substrate placed on the substrate stage 110.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510395184.0 filed on Jul. 7, 2015, the disclosure of which is hereby entirely incorporated by reference.

What is claimed is:

1. A transfer apparatus, comprising:
a supporting member,
a free electron excitation device, configured to excite a semiconductor material of a transferred object to generate free electrons; and
a detection device, configured to detect whether a surface of the transferred object in contact with a support surface of the supporting member becomes conductive or not.

2. The transfer apparatus according to claim 1, wherein the free electron excitation device is a heat excitation device, a light excitation device, or an electromagnetic field excitation device.

3. The transfer apparatus according to claim 2, wherein the electromagnetic field excitation device comprises an electromagnet attached to the supporting member.

4. The transfer apparatus according to claim 3, wherein the electromagnetic field excitation device further comprises a power supply device, the electromagnet comprises a coil that comprises two terminals, and the power supply is connected with the two terminals of the coil of the electromagnet and is configured to supply power to the coil.

5. The transfer apparatus according to claim 3, wherein the detection device comprises:
at least two electrodes, which are attached to the support surface of the supporting member and are configured to be in contact with a surface of the transferred object in operation;
a voltage source, which is connected with the at least two electrodes in series and are configured to apply a voltage to the at least two electrodes; and
a current detection module, which is connected with the at least two electrodes in series and are configured to detect whether a current is generated between the at least two electrodes.

6. The transfer apparatus according to claim 5, wherein each of the at least two electrodes is a stripe electrode and is disposed to extend along an edge of a region in which the electromagnet is disposed.

7. The transfer apparatus according to claim 1, wherein the support surface of the support member is provided with at least one cushion member, and the at least one cushion member is configured to suck the transferred object.

8. The transfer apparatus according to claim 1, wherein the supporting member comprises at least two supporting arms, each of which is provided with at least two cushion members, and the free electron excitation device and the detection device are provided on same one of the at least two supporting arms.

9. The transfer apparatus according to claim 4, wherein the detection device comprises:
at least two electrodes, which are attached to the support surface of the supporting member and are configured to be in contact with a surface of the transferred object in operation;
a voltage source, which is connected with the at least two electrodes in series and are configured to apply a voltage to the at least two electrodes; and
a current detection module, which is connected with the at least two electrodes in series and are configured to detect whether a current is generated between the at least two electrodes.

10. The transfer apparatus according to claim 9, wherein each of the at least two electrodes is a stripe electrode and is disposed to extend along an edge of a region in which the electromagnet is disposed.

11. The transfer apparatus according to claim 2, wherein the support surface is provided with at least one cushion member, and the at least one cushion member is configured to suck the transferred object.

12. The transfer apparatus according to claim 11, wherein the supporting member comprises at least two supporting arms, each of which is provided with at least two cushion members, and the free electron excitation device and the detection device are mounted on same one of the at least two supporting arms.

13. The transfer apparatus according to claim 3, wherein the support surface is provided with at least one cushion member, and the at least one cushion member is configured to suck the transferred object.

14. The transfer apparatus according to claim 13, wherein the supporting member comprises at least two supporting arms, each of which is provided with at least two cushion members, and the free electron excitation device and the detection device are mounted on same one of the at least two supporting arms.

15. The transfer apparatus according to claim 4, wherein the support surface is provided with at least one cushion member, and the at least one cushion member is configured to suck the transferred object.

16. The transfer apparatus according to claim 15, wherein the supporting member comprises at least two supporting arms, each of which is provided with at least two cushion members, and the free electron excitation device and the detection device are mounted on same one of the at least two supporting arms.

17. The transfer apparatus according to claim 5, wherein the support surface is provided with at least one cushion member, and the at least one cushion member is configured to suck the transferred object.

18. The transfer apparatus according to claim 17, wherein the supporting member comprises at least two supporting arms, each of which is provided with at least two cushion members, and the free electron excitation device and the detection device are mounted on same one of the at least two supporting arms.

19. A laser annealing apparatus, comprising a substrate stage, a laser configured to generate a laser beam, and the transfer apparatus according to claim 1.

20. The laser annealing apparatus according to claim 19, wherein the laser is an excimer laser.

\* \* \* \* \*